(12) United States Patent
Kazmierski et al.

(10) Patent No.: US 8,272,768 B2
(45) Date of Patent: Sep. 25, 2012

(54) LIGHT EMITTING DEVICE

(75) Inventors: Andrei Kazmierski, Himeji (JP); Tomihiko Ikeda, Himeji (JP)

(73) Assignee: Phoenix Electric Co., Ltd., Himeji-shi (Hyogo) (JP)

( * ) Notice: Subject to any disclaimer, the term of this patent is extended or adjusted under 35 U.S.C. 154(b) by 0 days.

(21) Appl. No.: 13/029,855

(22) Filed: Feb. 17, 2011

(65) Prior Publication Data

US 2011/0255290 A1    Oct. 20, 2011

(30) Foreign Application Priority Data

Apr. 16, 2010   (JP) .................................. 2010-095060

(51) Int. Cl.
*F21V 3/00*   (2006.01)
(52) U.S. Cl. .................. 362/311.06; 362/268; 362/297; 362/309; 362/311.01; 362/311.02
(58) Field of Classification Search .................. 362/257, 362/268, 296.01, 296.05, 297, 299–300, 362/307–310, 311.01–311.02, 311.06–311.08, 362/311.1, 326–328, 335
See application file for complete search history.

(56) References Cited

U.S. PATENT DOCUMENTS

2004/0207999 A1   10/2004   Suehiro et al.
2009/0251897 A1*  10/2009   Kabuki et al. .................. 362/235

FOREIGN PATENT DOCUMENTS

| EP | 1764841 A1 | 3/2007 |
| JP | 2005-159149 | 6/2005 |
| JP | 2005-347224 A | 12/2005 |

OTHER PUBLICATIONS

Jenkins Francis A and White Harvey E, Thin Lenses, Fundamentals of Optics, 1976, pp. 60-61.

* cited by examiner

*Primary Examiner* — Stephen F Husar
*Assistant Examiner* — Meghan Dunwiddie
(74) *Attorney, Agent, or Firm* — Lucas & Mercanti, LLP

(57) ABSTRACT

The light emitting device comprises: a bowl-shaped reflector; a point light source; and a combined lens provided on the light axis of the point light source. And the combined lens has: a convex lens part having a focal point coinciding with the point light source, refracting center light around the light axis into parallel light; and a concave lens part provided around the convex lens part, and refracting and diffusing light having an angle with the light axis larger than an angle between the center light and the light axis so as to increase the angle with the light axis. A virtual focal point of the light refracted and diffused with the concave lens part coincides with the focal point of the paraboloid of revolution.

2 Claims, 3 Drawing Sheets

LIGHT EMITTING DEVICE

This application claims the priority of Japanese application No. 2010-095060 filed Apr. 16, 2010, the contents of which are incorporated herein by reference.

BACKGROUND OF THE INVENTION

1. Field of the Invention

The present invention relates to a light emitting device that radiates light from a point light source as parallel light or converging light.

2. Description of the Related Art

A light-emitting diode "LED", which has good points such as low power consumption and long operating life as against a conventional incandescent lamp, for example a halogen lamp, is widely used, because people become more ecology conscious. And people consider that using the LED is one policy for the energy-saving strategies. Particularly, it is highly required to use the LED as an alternate item of the incandescent lamp.

As against the halogen lamp, or "a line or a plane" filament emits light, the LED is a "point light source" because of its small light-emitting area. This results in that the light reflected with a concave reflecting surface becomes parallel light, with "parabola" concave reflecting surface, or converging light, with "ellipsoid" concave reflecting surface, using the LED in higher degree of accuracy than using the incandescent lamp. Because the light-emitting center of the point light source can be located easily at the focal point, or near the focal point, of the concave reflecting surface defined by a paraboloid of revolution or an ellipsoid of revolution.

But the light directly emitted from the reflector cannot be controlled merely by combining the LED and the reflector. "Directly" means that the light from the LED is emitted without any reflection on the concave reflecting surface. Especially, the light from the LED is the strongest on its light axis usually; the larger the angle between the light axis and the light is, the smaller the strength of the light becomes. In short, the LED is "a directional light source." Consequently, most of the light from the LED is emitted "directly" from the reflector without any reflection, or without any control, when the LED is located at inner-bottom of the reflector so that the light axis of the LED coincides with the center axis of the reflector. The center axis of the reflector is a center axis of rotation for the paraboloid of revolution or the ellipsoid of revolution.

On the other hand, according to the light source described in the Patent Document 1, Japanese Laid-Open Patent Publication No. 2005-347224, the LED is located at inner-bottom of the reflector defined by the ellipsoid of revolution so that the light axis of the LED coincides with the center axis of the reflector. Furthermore, a lens, with which the light on and near the light axis converges on the light-converging point by refracting, is provided on the light axis within the reflector.

According to such a light source in the Patent Document 1, the light on and near the light axis converges on the light-converging point by refracting on the lens. And the light which makes a large angle with the light axis of the LED is reflected on the concave reflecting surface and becomes the converging light to the light-converging point of the reflector as well as the light on and near the light axis.

SUMMARY OF THE INVENTION

But even the light emitting device according to the Patent Document 1, it is not satisfied in "accuracy of convergence." Further improvement has been required.

A light-emitting area of an LED is so small that the LED can be called "a point light source" in comparison with an incandescent lamp. But the light-emitting "area" having an actual space is not "a theoretical point" like "a focal point" of a paraboloid of revolution, which defines the concave reflecting surface. The light-emitting area of the LED, of course, is larger and wider than "the theoretical point."

Consequently, the light from the LED does not converge on the light-converging point actually. Because most of the light is emitted from near the focal point of the concave reflecting surface, or the ellipsoid of revolution, the light does not converge on "a point" but "an area." That is the reason for the request of the further improvement of "the accuracy of convergence."

Furthermore, according to the light emitting device in the Patent Document 1, the concave reflecting surface is defined by the ellipsoid of revolution. In contrast, light reflected with a concave reflecting surface defined by a paraboloid of revolution becomes parallel light. But actually, the light emitted from near the focal point does not become a theoretical parallel light. Consequently, it is required the further improvement of "parallelism."

The present invention is developed in view of the above-described problems of the conventional arts. A main object of the present invention is, thus, to improve "the parallelism" or "the accuracy of convergence" of the light from the point light source such as the LED or the like. Additional object of the present invention is to make the light emitting device which is easy to be set into an optical apparatus by making the reflector small for minimizing the optical apparatus size.

According to a first aspect of the present invention, a light emitting device 10 comprises:

a bowl-shaped reflector 12 having a concave reflecting surface 18 defined by a paraboloid of revolution, and a light-emitting opening 20;

a point light source 14 provided on the bottom of the concave reflecting surface 18 so as to face the light-emitting opening 20, and having a light axis L coinciding on the center axis CL of the paraboloid of revolution; and a combined lens 16 provided on the light axis L of the point light source 14 inside of the reflector 12, wherein the combined lens 16 has:

a convex lens part 34 having a focal point F2 coinciding with the point light source 14, refracting center light L1 around the light axis L into parallel light; and a ring-shaped concave lens part 36 provided around the convex lens part 34, and refracting and diffusing light L2 having an angle with the light axis L larger than an angle between the center light L1 and the light axis L so as to increase the angle with the light axis L, a virtual focal point Fv of light L2 refracted and diffused with the concave lens part 36 coincides with the focal point F1 of the paraboloid of revolution.

According to this light emitting device 10, the center light L1 around the light axis L of the point light source 14 is emitted as the parallel light from the light-emitting opening 20 of the reflector 12 following refraction on the convex lens part 34.

On the other hand, the light, called "peripheral light L2," having an angle with the light axis L larger than other angle between the center light L1 and the light axis L is emitted through the light-emitting opening 20 following refraction and diffusion on the ring-shaped concave lens part 36 around the convex lens part 34 and reflection on the concave reflecting surface 18 of the reflector 12.

The virtual focal point Fv of the concave lens part 36 coincides with the focal point F1 of the paraboloid of revolution defining the concave reflecting surface 18. This results in that the peripheral light L2 becomes the parallel light by reflected on the concave reflecting surface 18 as if the peripheral light L2 were emitted from the focal point F1 of the paraboloid of revolution to the concave reflecting surface 18.

As shown in FIG. 3(a), the virtual focal point Fv of the concave lens part 36 is located at a position nearer to the concave lens than the real light-emitting center Z. The virtual light-emitting area of the point light source 14 at the virtual focal point Fv is smaller than the real light-emitting area of the point light source 14. In contrast, as shown in FIG. 3(b), according to a convex lens, its virtual focal point Fv is located at a position farther from the convex lens than the real light-emitting center Z. And the virtual light-emitting area of the point light source 14 at the virtual focal point Fv is larger than the real light-emitting area of the point light source 14. Consequently, according to the light emitting device 10 in the present invention, the virtual light-emitting area of the point light source 14 comes closer to a theoretical "point" than the real light-emitting area.

As described above, according to the light emitting device 10 in the present invention, the peripheral light L2 from the point light source 14 becomes almost like the light emitted from a "point" light source smaller than the real light-emitting area. Consequently, a difference in size between the light source and the focal point F1 of the paraboloid of revolution becomes smaller.

Furthermore, as shown in FIG. 4, the peripheral light L2 is refracted and diffused into a direction that the angle between the light L2 and the light axis L becomes larger with the concave lens part 36. Then an illuminated area on the concave reflecting surface 18 with the peripheral light L2 becomes closer to the bottom of the concave reflecting surface 18. For example, as illustrated, if the concave lens part 36 does not exist, the peripheral light L2 becomes the light Lb as shown by broken lines that illuminates the area on the concave reflecting surface 18 farther from the point light source 14.

Unlike the case that the concave lens part 36 does not exist, the area, called "unilluminated area A," which is not illuminated with the peripheral light L2 exists on edge part of the light-emitting opening 20 of the concave reflecting surface 18. The unilluminated area A is unnecessary area, which does not contribute to the reflection of the peripheral light L2 Consequently, the reflector 12 can be made smaller More specifically, the smaller the diameter X of the light-emitting opening 20 is, for example X'>X in the figure, the shorter the distance B, or the depth of the reflector, between the bottom of the concave reflecting surface 18 and the light-emitting opening 20 is.

As is clear from the descriptions so far, the meaning of "the light axis coincides with the center axis C" is not limited to the case that the light axis C perfectly coincides with the center axis C. A gap between the light axis L and the center axis C, which is considered that the light axis substantially coincides with the center axis C, also is acceptable.

The point light source 14 is a light source whose light-emitting area is smaller than a light-emitting area of an incandescent lamp. The light-emitting area of the point light source 14 is not a theoretical "point" having no area.

According to a second aspect of the present invention, a light emitting device 10 comprises:

a bowl-shaped reflector 12 having a concave reflecting surface 18 defined by an ellipsoid of revolution, and a light-emitting opening 20;

a point light source 14 provided on the bottom of the concave reflecting surface 18 so as to face the light-emitting opening 20, and having a light axis L coinciding with the center axis CL of the ellipsoid of revolution; and a combined lens 16 provided on the light axis L of the point light source 14 inside of the reflector 12, wherein the combined lens 16 has:

a convex lens part 34 having a focal point F2 on the point light source 14 refracting and converging center light L1 around the light axis L to the light-converging point F3 of the ellipsoid of revolution; and a ring-shaped concave lens part 36 provided around the convex lens part 34, and refracting and diffusing the light L2 having an angle with the light axis L larger than an angle between the center light L1 and the light axis L, a virtual focal point Fv of light L2 refracted and diffused with the concave lens part 36 coincides with the focal point F1 of the ellipsoid of revolution.

According to this light emitting device 10, the center light L1 around the light axis L of the point light source 14 converges at the light-converging point F3 of the ellipsoid of revolution defining the concave reflecting surface 18 following refraction on the convex lens part 34.

On the other hand, the light, called "peripheral light L2," having an angle with the light axis L larger than an angle between the center light L1 and the light axis L is emitted through the light-emitting opening 20 following refraction and diffusion on the ring-shaped concave lens part 36 around the convex lens part 34 and reflection on the concave reflecting surface 18 of the reflector 12.

The virtual focal point Fv of the concave lens part 36 coincides with the focal point F1 of the ellipsoid of revolution defining the concave reflecting surface 18 as well as the first aspect of the present invention. This results in that the peripheral light L2 becomes the converging light by reflected on the concave lens part 36 as if the converging light were emitted from the focal point F1 of the ellipsoid of revolution to the concave reflecting surface 18.

The virtual focal point Fv of the concave lens part 36 is located at a position nearer to the concave lens than the real light-emitting center Z. As described above, the virtual light-emitting area, located at the virtual focal point Fv, of the point light source 14 comes closer to a theoretical "point" than the real light-emitting area.

The peripheral light L2 from the point light source 14 becomes almost like the light emitted from a "point" light source smaller than the real light-emitting area. Consequently, "the accuracy of convergence" of the peripheral light L2 emitted from the light-emitting opening 20 of the reflector 12 is improved.

Furthermore, as well as the light emitting device according to the first aspect of the present invention, the peripheral light L2 is refracted and diffused into a direction that the angle between the light L2 and the light axis L becomes larger with the concave lens part 36. The peripheral light L2 following the diffusion does not illuminate the end, called "unilluminated area A," located adjacent to the light-emitting opening 20 of the concave reflecting surface 18. The unilluminated area A is not necessary, so that the reflector 12 can be smaller.

According to the present invention, "the parallelism" or "the accuracy of convergence" of the peripheral light L2 emitted from the light-emitting opening of the reflector can be improved. Furthermore, the reflector can be made smaller in size, so that the light emitting device which is easy to be set into an optical apparatus, for example a projector, can be provided.

DETAILED DESCRIPTION

Figure 1:
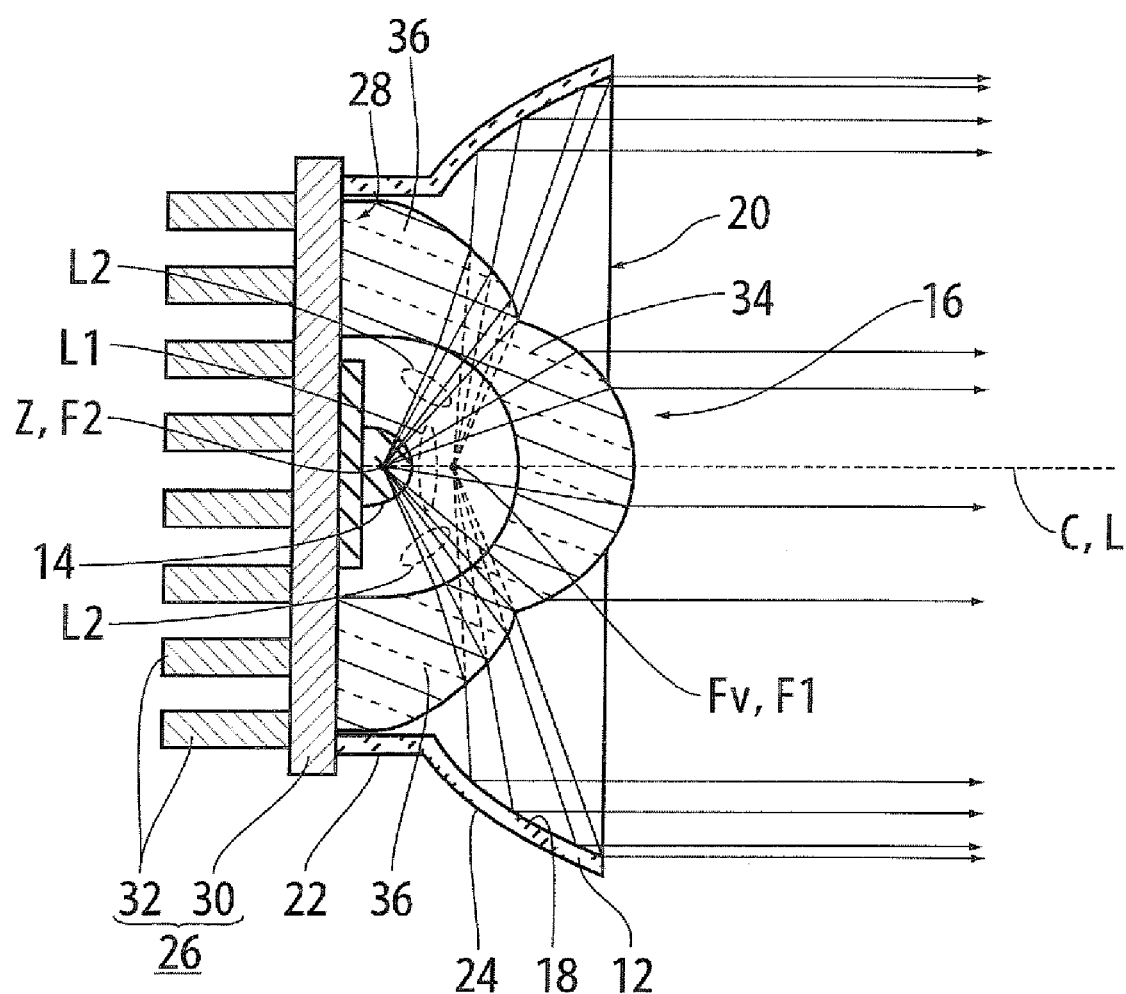
FIG. 1 is a cross-sectional view showing a light emitting device of the present invention.

A light emitting device 10 according to the present invention is explained with figures as below. The light emitting device 10 comprises: a reflector 12, a heat sink 26 for absorption and radiation of heat, a point light source 14, and a combined lens 16.

The reflector 12 has a concave reflecting surface 18 formed inside, a light-emitting opening 20 through which light from the point light source 14 is emitted, and an almost cylindrical center cylindrical part 22 provided on the bottom-center of the concave reflecting surface 18 and facing the light-emitting opening 20. A center axis C for the reflector 12 and the concave reflecting surface 18 is a line passing through the center of the reflector 12 and being perpendicular to the light-emitting opening 20.

The reflector 12 is made of glass or aluminum, for example. The reflector 12, which is made of aluminum, has the concave reflecting surface 18 made by metal evaporation. The reflector 12, which is made of glass, has the concave reflecting surface 18 made by metal evaporation or made of infrared transmitting glass on a surface of an umbrella-shaped main body 24 of the reflector 12. In the light emitting device 10 of this embodiment, a heat sink 26 is provided at an end of the center cylindrical part 22 of the reflector 12, and the point light source 14 is provided on a surface facing the light-emitting opening 20 of the heat sink 26. This results in that heat from the point light source 14 can be radiated efficiently from the heat sink 26. Consequently, plastics, which are weaker against heat than the glass and the aluminum against heat, can be used as material of the reflector 12. In this embodiment, the combined lens 16 covers the point light source 14, so that the point light source 14 is not exposed outside directly through the light-emitting opening 20 of the reflector 12. Consequently, a front cover (not shown) covering the light-emitting opening 20 is not essential for the light emitting device 10.

The concave reflecting surface 18 is defined by a paraboloid of revolution around the center axis C. The focal point F1 of the paraboloid of revolution is provided on the center axis C inside of the reflector 12. The position of the focal point F1 is determined on the basis of a size or a number, for example, of the point light source 14 located inside of the reflector 12. In addition, the concave reflecting surface 18 may be defined by an ellipsoid of revolution around the center axis C as described below.

The heat sink 26 is made of high thermal conductivity material, for example copper, aluminum, and or the like. In other words, the heat sink 26 can be made of material having required thermal conductivity on the basis of an amount of heat from the point light source 14 or the like. And the heat sink 26 is provided not only for radiating heat from the point light source 14 efficiently but for fixing the point light source 14 inside of the reflector 12 and for supplying electric power from outside to the point light source 14 as a feeder. For example, an electrical circuit etched on the surface of the heat sink 26 can be acceptable.

This heat sink 26 comprises: a base plate 30 provided for covering an opening 28 at the end of the center cylindrical part. 22 of the reflector 12; and columnar heat radiators 32 whose end surfaces are fixed to outer surface of the base plate 30. The heat radiators 32 may be cylindrical or prismatic. Furthermore, reed-shaped heat radiators 32 may be used. But the reed-shaped heat radiators 32 cause decrease of radiation efficiency.

The point light source 14 typified by a LED is an electronic component that emits light, for example its angle of radiation is 120 degree, by electric current. The point light source 14 is provided on a surface, which faces the light-emitting opening 20, of the base plate 30 of the heat sink 26. The light axis L of the point light source 14 is positioned so as to coincide with the center axis C of the concave reflecting surface 18.

In this specification, "the light axis L coincides with the center axis C" means not only "the light axis L perfectly coincides with the center axis C" but also "the light axis L substantially coincides with the center axis C." In other words, a certain level of gap, which is considered that the light axis substantially coincides with the center axis C, can be acceptable. And the point light source 14 is a light source whose light-emitting area is smaller than a light-emitting area of an incandescent lamp. Consequently, the "point" does not mean a theoretical "point" having no area.

Figure 2:
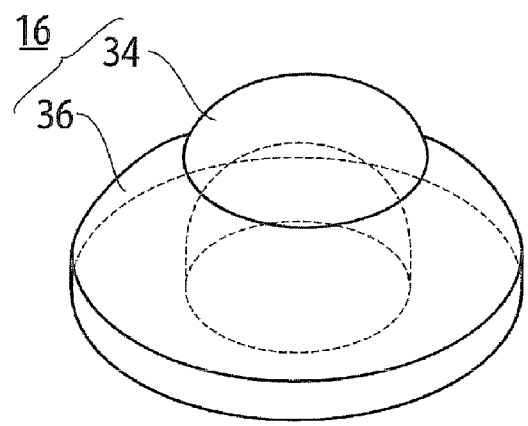
FIG. 2 is a perspective view of a combined lens.

As shown in FIG. 2, the combined lens 16 provided on the light axis L of the point light source 14 inside of the reflector 12 integrally comprises a convex lens part 34 and a concave lens part 36 provided around the convex lens part 34. The combined lens 16 is made of polycarbonate, glass, or other clear material which have resistance against heat from the point light source 14.

The convex lens part 34 refracts the center light L1 around the light axis L of the point light source 14 to parallel light. And the focal point F2 of the convex lens part 34 coincides with the illuminating center Z.

The concave lens part 36 diffuses the light, or the peripheral light L2, having an angle with the light axis L larger than an angle between the center light L1 and the light axis L, so as to increase the angle with the light axis L. The concave lens part 36 forms a virtual focal point Fv of the light L2 following the refraction between the concave lens part 36 and the illuminating center Z of the point light source 14, and the virtual focal point Fv coincides with the focal point F1 of the paraboloid of revolution.

This light emitting device 10 is, for example, manufactured in accordance with the following procedure. The point light source 14 is mounted on the surface of the base plate 30 of the heat sink 26. The heat sink 26 is adhered on the end of the center cylindrical part 22 of the reflector 12 with inorganic adhesive or the like. After that, the combined lens 16 is inserted inside of the reflector 12 through the light-emitting opening 20, and fixed. The combined lens 16 may be fixed by abutting lower surface, which is facing the base plate 30 of the heat sink 26, of the concave lens part 36 on the surface of the base plate 30 as shown in FIG. 1, or by inserting a spacer (not shown) between the base plate 30 and the concave lens part 36. And the combined lens 16 may be adhered inside of the center cylindrical part 22 of the reflector 12.

According to the light emitting device 10 in this embodiment, the center light L1 from the point light source 14 is emitted as the parallel light from the light-emitting opening 20 of the reflector 12 following refraction on the convex lens part 34. On the other hand, the peripheral light L2 is emitted through the light-emitting opening 20 following refraction and diffusion on the ring-shaped concave lens part 36 around the convex lens part 34 and reflection on the concave reflecting surface 18 of the reflector 12.

The virtual focal point Fv of the concave lens part 36 coincides with the focal point F1 of the paraboloid of revolution defining the concave reflecting surface 18. This results in that the peripheral light L2 becomes the parallel light by reflected on the concave reflecting surface 18 as if the peripheral light L2 were emitted from the focal point F1 of the paraboloid of revolution to the concave reflecting surface 18.

Figure 3:
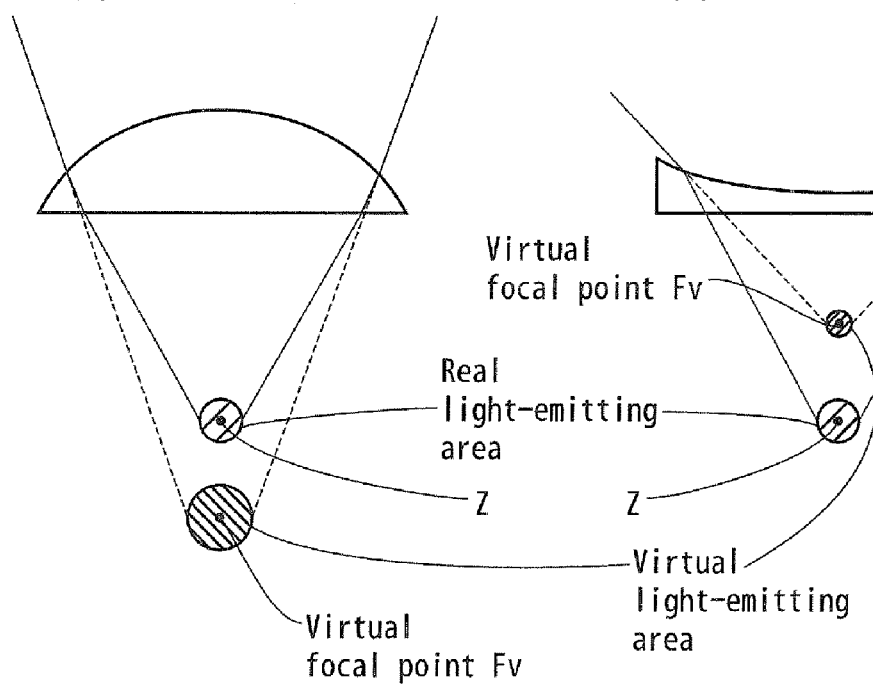
FIG. 3 is a diagram showing the relation between a position where a virtual focal point is located and a virtual light-emitting area of the point light source.

The virtual focal point Fv of a concave lens is located at a position closer to the concave lens than the real light-emitting center Z. As shown in FIG. 3(a), the virtual light-emitting area of the point light source 14 at the virtual focal point Fv is smaller than the real light-emitting area of the point light source 14. In contrast, as shown in FIG. 3(b), in a convex lens, its virtual focal point Fv is located at a position farther to the convex lens than the real light-emitting center Z. And the virtual light-emitting area of the point light source 14 at the virtual focal point Fv is larger than the real light-emitting area of the point light source 14. Consequently, according to the light emitting device 10 in this embodiment, the virtual light-emitting area of the point light source 14 comes closer to a theoretical "point" than the real light-emitting area.

As described above, according to the light emitting device 10 in this embodiment, the peripheral light L2 from the point light source 14 becomes almost like the light emitted from a "point" light source smaller than the real light-emitting area and including the focal point F1 of the paraboloid of revolution. Consequently, "the parallelism" of the peripheral light L2 emitted from the light-emitting opening 20 of the reflector 12 is improved.

Figure 4:
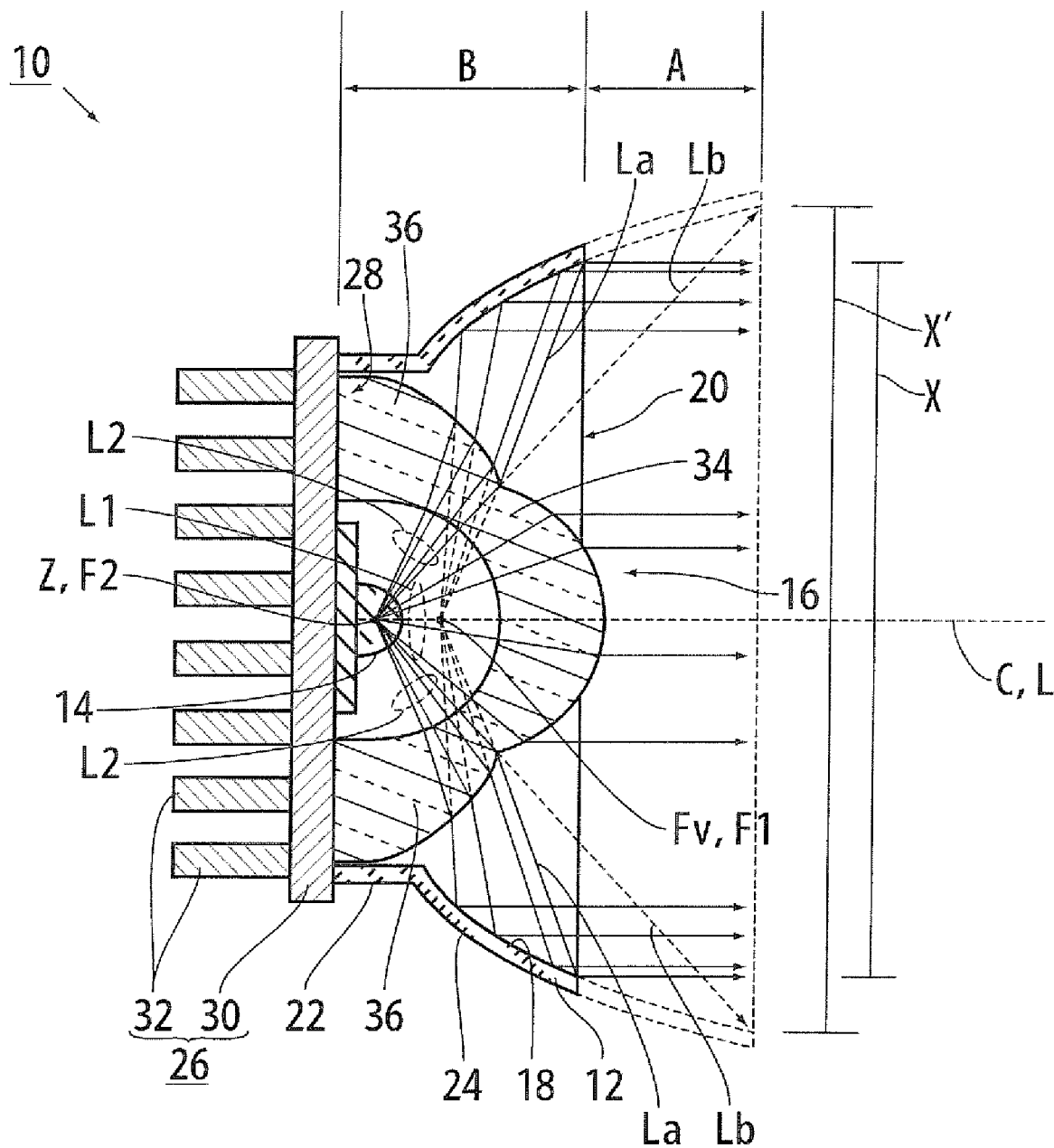
FIG. 4 is a diagram showing that a reflector can be smaller than a conventional reflector.

Furthermore, as shown in FIG. 4, the peripheral light L2 is refracted and diffused into a direction that the angle between the light L2 and the light axis L becomes larger with the concave lens part 36. Then an illuminated area on the concave reflecting surface 18 with the peripheral light L2 becomes closer to the bottom of the concave reflecting surface 18. For example, as illustrated in FIG. 4, if the concave lens part 36 does not exist, the peripheral light L2 becomes the light Lb as shown by broken lines that illuminates the area on the concave reflecting surface 18 farther from the point light source 14.

Unlike the case that the concave lens part 36 does not exist, the area, called "unilluminated area A," which is not illuminated with the peripheral light L2 exists on edge part of the light-emitting opening 20 of the concave reflecting surface 18. The unilluminated area A is unnecessary area, which does not contribute to the reflection of the peripheral light L2. Consequently, the reflector 12 can be made smaller. More specifically, the smaller the diameter X of the light-emitting opening 20 is, for example X'>X in the figure, the shorter the distance B, or the depth of the reflector, between the bottom of the concave reflecting surface 18 and the light-emitting opening 20 is. Consequently, the light emitting device which is easy to be set into an optical apparatus, for example a projector, can be provided.

In addition, the light emitting device 10 emitting parallel light is described above. The concave reflecting surface 18 of the reflector 12 may be defined by the ellipsoid of revolution; the combined lens 16 may be comprises a convex lens part 34 refracting the center light L1 to converging light to the converging point F3 of the ellipsoid of revolution and a concave lens part 36 whose virtual focal point Fv coincides with the focal point F1 of the ellipsoid of revolution.

When the ellipsoid of revolution is used, the center light L1 converges at the converging point F3 (not shown) of the ellipsoid of revolution defining the concave reflecting surface 18 following refraction on the convex lens part 34.

On the other hand, the peripheral light L2 is emitted through the light-emitting opening 20 following refraction and diffusion on the concave lens part 36 around the convex lens part 34 and reflection on the concave reflecting surface 18 of the reflector 12.

The virtual focal point Fv of the concave lens part 36 coincides with the focal point F1 of the ellipsoid of revolution defining the concave reflecting surface 18 as well as the embodiment described above. This results in that the peripheral light L2 becomes the converging light by reflected on the concave lens part 36 as if the converging light were emitted from the focal point F1 of the ellipsoid of revolution to the concave reflecting surface 18. The virtual focal point Fv of the concave lens part 36 is located at a position closer to the concave lens than the real light-emitting center Z. As described above, the virtual light-emitting area, located at the virtual focal point Fv, of the point light source 14 comes closer to a theoretical "point" than the real light-emitting area.

The peripheral light L2 from the point light source 14 becomes almost like the light emitted from a "point" light source smaller than the real light-emitting area. Consequently, "the accuracy of convergence" of the peripheral light L2 emitted from the light-emitting opening 20 of the reflector 12 is improved.

Furthermore, as well as the light emitting device according to the embodiment described above, the peripheral light L2 is refracted and diffused into a direction that the angle between the light L2 and the light axis L becomes larger with the concave lens part 36. The peripheral light L2 following the diffusion does not illuminate the unilluminated area A of the light-emitting opening 20 of the concave reflecting surface 18. The unilluminated area A is not necessary, so that the reflector 12 can be smaller.

Although the invention has been described in its preferred form with a certain degree of particularity, it is understood that the present disclosure of the preferred form has been changed in the details of construction and the combination and arrangement of parts may be resorted to without departing from the spirit and scope of the invention as hereinafter claimed.

The disclosure of Japanese Patent Application No. 2010-95060 filed Apr. 16, 2010 including specification, drawings and claims is incorporated herein by reference in its entirety.

What is claimed is:
1. A light emitting device comprising:
a bowl-shaped reflector having a concave reflecting surface defined by a paraboloid of revolution, and a light-emitting opening;
a point light source provided on the bottom of the concave reflecting surface so as to face the light-emitting opening, and having a light axis coinciding on the center axis of the paraboloid of revolution; and
a combined lens provided on the light axis of the point light source inside of the reflector,
wherein the combined lens has:
a convex lens part having a focal point coinciding with the point light source, refracting center light around the light axis into parallel light; and a ring-shaped concave lens part provided around the convex lens part, and refracting and diffusing light having an angle with the light axis larger than an angle between the center light and the light axis so as to increase the angle with the light axis, a virtual focal point of light refracted and diffused with the concave lens part coincides with the focal point of the paraboloid of revolution.

2. A light emitting device comprising:

a bowl-shaped reflector having a concave reflecting surface defined by an ellipsoid of revolution, and a light-emitting opening;

a point light source provided on the bottom of the concave reflecting surface so as to face the light-emitting opening, and having a light axis coinciding with the center axis of the ellipsoid of revolution; and a combined lens provided on the light axis of the point light source inside of the reflector, wherein the combined lens has:

a convex lens part having a focal point on the point light source refracting and converging center light around the light axis to the light-converging point of the ellipsoid of revolution; and a ring-shaped concave lens part provided around the convex lens part, and refracting and diffusing the light having an angle with the light axis larger than an angle between the center light and the light axis, a virtual focal point of light refracted and diffused with the concave lens part coincides with the focal point of the ellipsoid of revolution.

* * * * *